(12) United States Patent
Yang et al.

(10) Patent No.: US 7,974,054 B2
(45) Date of Patent: Jul. 5, 2011

(54) INTEGRATED CIRCUIT WITH ELECTROSTATIC DISCHARGE PROTECTION CIRCUIT

(75) Inventors: Ching-Jung Yang, Hsinchu (TW); Kun-Tai Wu, Hsinchu (TW)

(73) Assignee: Raydium Semiconductor Corporation, Hsinchu Science Park, Hsinchu (TW)

( * ) Notice: Subject to any disclaimer, the term of this patent is extended or adjusted under 35 U.S.C. 154(b) by 527 days.

(21) Appl. No.: 12/244,745

(22) Filed: Oct. 2, 2008

(65) Prior Publication Data
US 2009/0195949 A1    Aug. 6, 2009

(30) Foreign Application Priority Data
Jan. 31, 2008  (TW) ................................ 97103697 A

(51) Int. Cl.
*H02H 9/00* (2006.01)

(52) U.S. Cl. ........................................................ 361/56
(58) Field of Classification Search ..................... 361/56
See application file for complete search history.

(56) References Cited

U.S. PATENT DOCUMENTS 6,903,913 B2 * 6/2005 Ker et al. ..................... 361/111
6,954,098 B2 * 10/2005 Hsu et al. .................... 327/313
7,242,558 B2 * 7/2007 Chen ............................ 361/56

* cited by examiner

*Primary Examiner* — Stephen W Jackson
(74) *Attorney, Agent, or Firm* — Winston Hsu; Scott Margo

(57) ABSTRACT

An integrated circuit with an electrostatic discharge protection circuit includes a first power pad, a second power pad, at least a circuit module, and a power clamp circuit. The circuit module includes a signal pad, an internal circuit and a first bipolar transistor. A first parasitical resistance is coupled between a collector of the first bipolar transistor and the second power pad. There is at least a metal-oxide semiconductor (MOS) transistor and at least a first parasitical bipolar transistor included within the power clamp circuit.

7 Claims, 5 Drawing Sheets

INTEGRATED CIRCUIT WITH ELECTROSTATIC DISCHARGE PROTECTION CIRCUIT

BACKGROUND OF THE INVENTION

1. Field of the Invention

The present invention relates to an integrated circuit, and more particularly to an integrated circuit having an electrostatic discharge (ESD) protection circuit, where the integrated circuit utilizes a bipolar transistor and substrate triggering technique to improve/enhance ESD protection ability.

2. Description of the Prior Art

In advanced semiconductor manufacturing processes, a multi-functions circuit can be integrated into a single chip, in which a conducting pad on the chip is utilized for receiving an external voltage source (e.g., a bias source) or for exchanging data with other external circuits/chips. For example, the power pads installed on the chip is utilized for receiving bias voltages, i.e., the VDD node and VSS node. Furthermore, the signal pad, i.e., I/O pad, installed on the chip is utilized for receiving an input signal and/or an output signal.

In this way, the chip communicates with other circuits/chips through the above-mentioned conducting pads. The electro static signal, however, may be transmitted into the chip through the pads of the chip during the processes of manufacturing, packaging, testing, or shipping, and damage the internal circuit of the chip. Thus, in advanced semiconductor integrated circuits, an electro-static discharge (ESD) circuit is an important element utilized for protecting the internal circuit from being damaged by the electro static signal.

Conventionally, the ESD circuit is installed between every two pads of the chip. When the electro static signal occurs in the chip, the ESD circuit conducts a low resistance current path between the two pads for bypassing the current induced by the electro static signal, thereby preventing the current from flowing into the internal circuit of the chip. Accordingly, the internal circuit of the chip can be protected by the ESD circuit.

The ability of the ESD circuit to discharge the electro static signal can be tested through the following modes: positive to VSS (PS) mode, negative to VSS (NS) mode, positive to VDD (PD) mode, negative to VDD (ND) mode, and inter-power mode (e.g., VDD to VSS (DS) mode). For the example of the PS mode, when the chip is tested under the PS mode, the pad connected to the VSS is connected to ground, and a positive electro static signal is generated at the pad under test of the chip for turning on the ESD circuit to discharge the electro static signal into the pad connected to the VSS. Meanwhile, the pad connected to the VDD and the other pads are floating. When the chip is tested under the ND mode, the pad connected to the VDD is connected to ground, and a negative electro static signal is generated at the pad under test of the chip for turning on the ESD circuit to discharge the electro static signal into the pad connected to the VDD. Meanwhile, the pad connected to the VSS and the other pads are floating.

Please refer to FIG. 1. FIG. 1 is a diagram illustrating a conventional electro-static discharge (ESD) integrated circuit 100. The integrated circuit 100 comprises a first power pad 101, a second power pad 102, a signal pad 103, a resistive element 105, an internal circuit 110, two diodes 121, 122, and a power clamp circuit 130, wherein the power clamp circuit 130 comprises a gate-grounded N type metal oxide semiconductor (MOS) transistor 132 and a gate-powered P type MOS transistor 134. In FIG. 1, the first power pad 101 is connected to the VDD node, and the second power pad 102 is connected to the VSS node. Conventionally, the power clamp circuit 130 can also be implemented by only the gate-grounded N type MOS transistor 132 or only the gate-powered P type MOS transistor 134.

Please refer to FIG. 1 again. The diode 121 is configured as the ESD protection circuit between the signal pad 103 and the first power pad 101, and the diode 122 is configured as the ESD protection circuit between the signal pad 103 and the first power pad 102. Furthermore, the above-mentioned power clamp circuit 130 is configured as the ESD protection circuit between the first power pad 101 (i.e., VDD) and the second power pad 102 (i.e., VSS).

When enlarging the size of the N type MOS transistor 132 or the P type MOS transistor 134, the ability to discharge the electro static signal may not improve accordingly since the N type MOS transistor 132 and the P type MOS transistor 134 do not turn on concurrently. Therefore, a novel ESD protection mechanism should be introduced to solve the above-mentioned problem.

SUMMARY OF THE INVENTION

One of the objectives of the present invention is to provide an integrated circuit having an electrostatic discharge (ESD) protection circuit, where the integrated circuit utilizes a bipolar transistor and substrate triggering technique to improve/enhance ESD protection ability.

According to an embodiment of the present invention, an integrated circuit having an electrostatic discharge (ESD) protection circuit is disclosed. The integrated circuit comprises a first power pad, a second power pad, at least one circuit module, and a power clamp circuit. The circuit module comprises a signal pad, an internal circuit, and a first bipolar transistor. The internal circuit couples between the first power pad and the second power pad; and the first bipolar transistor has a base node coupled to the first power pad, and an emitter node coupled to the signal pad, wherein a first parasitic resistor is coupled between a collector node of the first bipolar transistor and the second power pad. The power clamp circuit couples between the first power pad and the second power pad, and the power clamp circuit comprises at least a first metal oxide semiconductor transistor and at least a first parasitic bipolar transistor. The first metal oxide semiconductor transistor has a control node coupled to the second power pad, a first connection node coupled to the first power pad, and a second connection node coupled to the second power pad; and the first parasitic bipolar transistor has a collector node coupled to the first connection node of the first metal oxide semiconductor transistor, an emitter node coupled to the second connection node of the first metal oxide semiconductor transistor, and a base node coupled to the collector node of the first bipolar transistor and the first parasitic resistor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
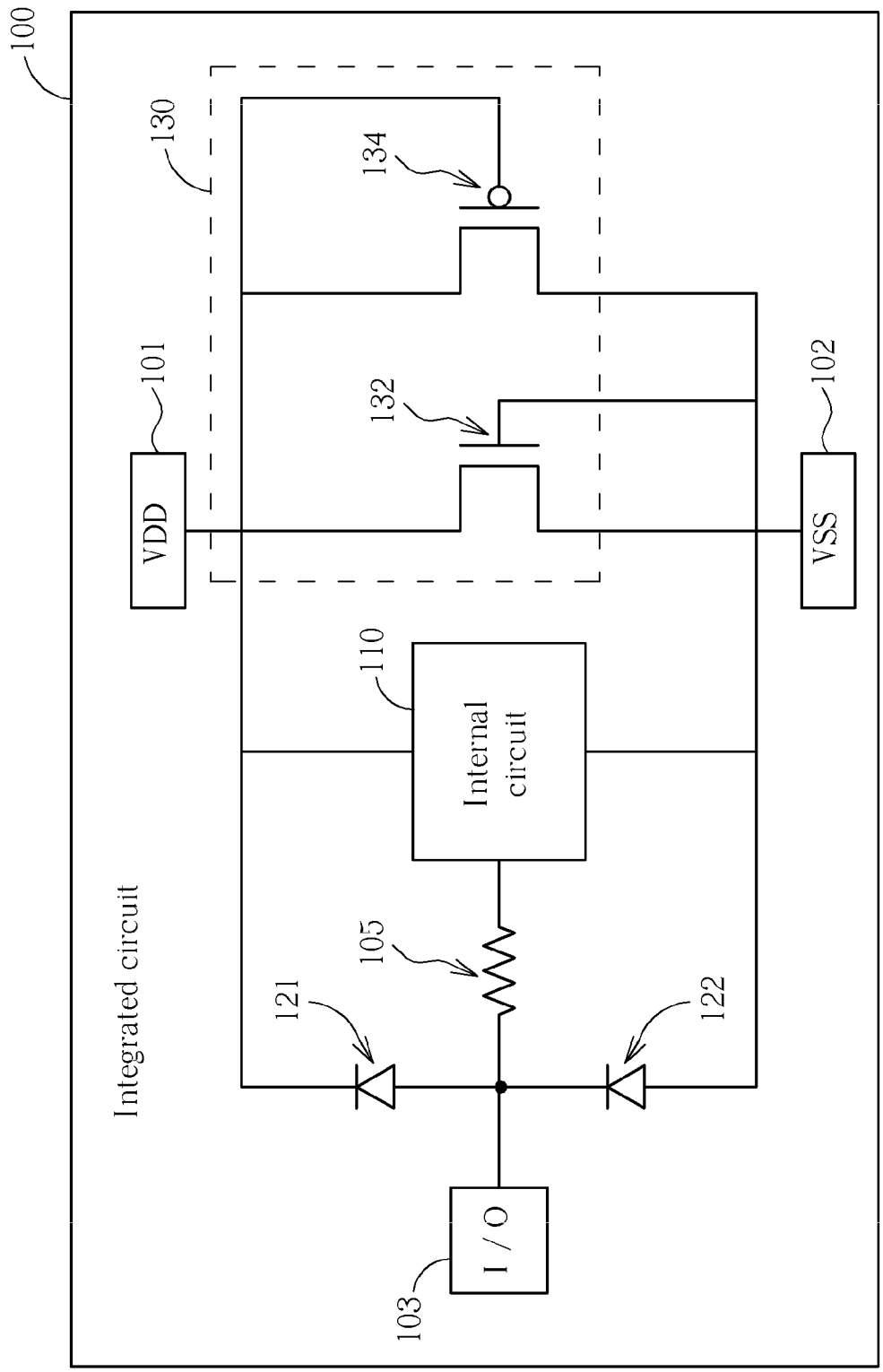
FIG. 1 is a diagram illustrating a conventional electro-static discharge (ESD) integrated circuit.
Figure 2:
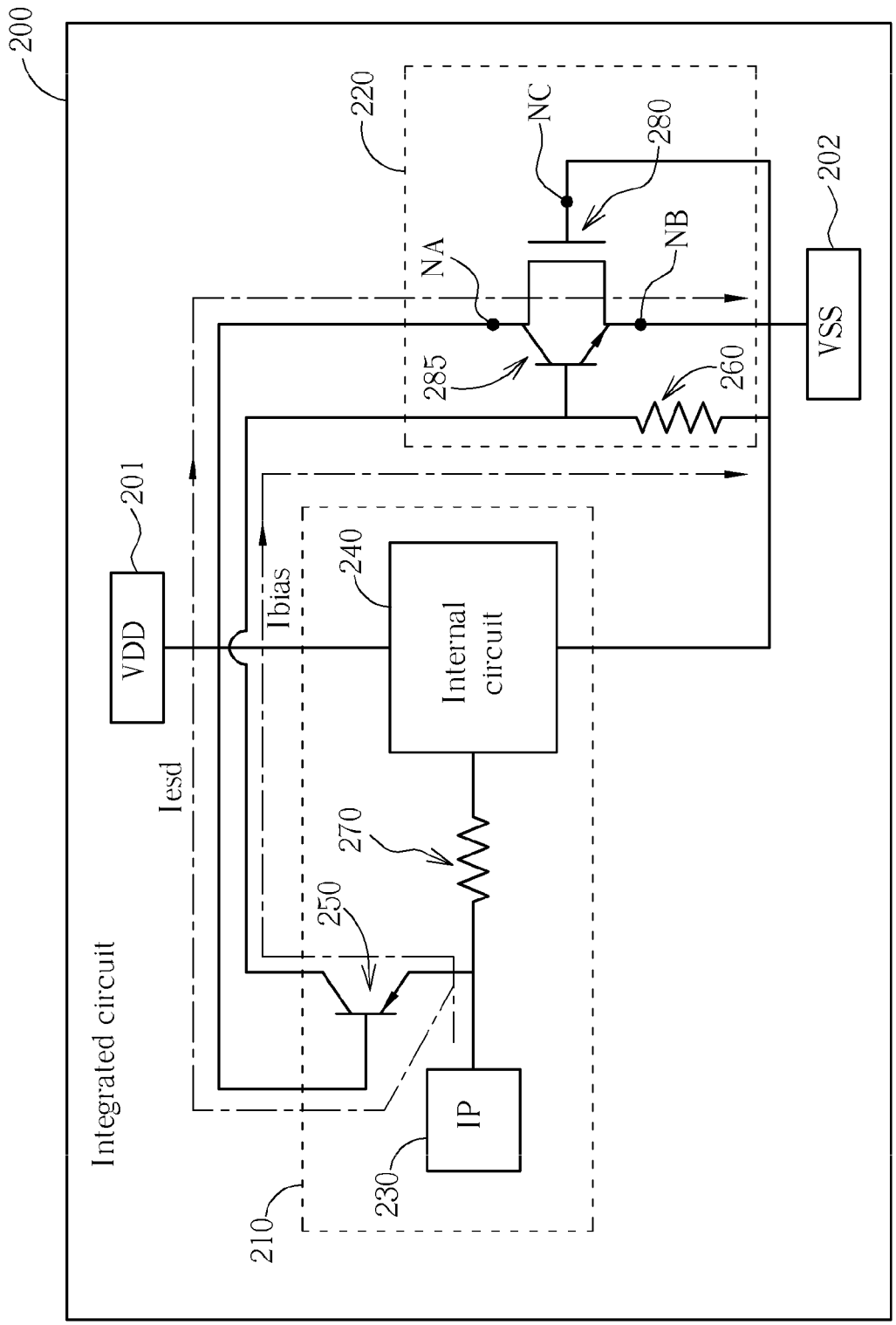
FIG. 2 is a diagram illustrating an integrated circuit having an electrostatic discharge protection circuit according to a first embodiment of the present invention.

Please refer to FIG. 2. FIG. 2 is a diagram illustrating an integrated circuit 200 having an electrostatic discharge (ESD) protection circuit according to a first embodiment of the present invention. The integrated circuit 200 comprises a first power pad 201, a second power pad 202, at least one circuit module 210, and a power clamp circuit 220. Furthermore, the power clamp circuit 220 of the integrated circuit 200 comprises a first parasitic bipolar transistor 285. In addition, according to the first embodiment of the present invention, the first power pad 201 is coupled to a terminal VDD, and the second power pad 202 is coupled to a terminal VSS.

As shown in FIG. 2, the circuit module 210 comprises a signal pad 230, an internal circuit 240, and a first bipolar transistor 250. However, the circuit module 210 may further comprise an impedance device 270 according to practical requirements, as shown in FIG. 2. For the sake of brevity, the signal pad 230 is an input signal pad (IP) in the following description. The internal circuit 240 in the circuit module 210 is coupled between the first power pad 201 and the second power pad 202. The first bipolar transistor 250 in the circuit module 210 has a base node coupled to the first power pad 201 (i.e., terminal VDD), and an emitter node coupled to the signal pad 230. Furthermore, a first parasitic resistor 260 is induced between a collector node of the first bipolar transistor 250 and the second power pad 202 (i.e., terminal VSS). According to the first embodiment, the first bipolar transistor 250 is a P type bipolar transistor, but this is not the limitation of the present invention. In other words, according to another embodiment of the present invention, the first bipolar transistor in the circuit module 210 can also be an N type bipolar transistor, or an N type bipolar transistor in conjunction with a P type bipolar transistor. The various designs of the bipolar transistor of the circuit module 210 are disclosed in the following description.

Please refer to FIG. 2 again. The power clamp circuit 220 is coupled between the first power pad 210 (i.e., terminal VDD) and the second power pad 202 (i.e., terminal VSS), and the power clamp circuit 220 is implemented by a first metal oxide semiconductor transistor 280 in this embodiment. However, the number of metal oxide semiconductor transistors is not a limitation of the present invention. In other words, the power clamp circuit 220 can also be implemented by two kinds of metal oxide semiconductor transistors in another embodiment of the present invention, such as N type and P type metal oxide semiconductor transistors.

According to the first embodiment, a control node NC of the first metal oxide semiconductor transistor 280 in the power clamp circuit 220 is coupled to the second power pad 202 (i.e., terminal VSS), a first connection node NA is coupled to the first power pad 201 (i.e., terminal VDD), and a second connection node NB is coupled to the second power pad 202 (i.e., terminal VSS). Since the first metal oxide semiconductor transistor 280 is an N type metal oxide semiconductor transistor, the above-mentioned control node NC is a gate node, the first connection node NA is a drain node, and the second connection node NB is a source node. Furthermore, in FIG. 2, a collector node of the first parasitic bipolar transistor 285 is coupled to the first connection node NA of the first metal oxide semiconductor transistor 280, an emitter node of the first parasitic bipolar transistor 285 is coupled to the second connection node NB of the first metal oxide semiconductor transistor 280, and a base node of the first parasitic bipolar transistor 285 is coupled to the collector of the first bipolar transistor 250 and the first parasitic resistor 260. As known by those skilled in this art, the power clamp circuit further includes a first parasitic bipolar transistor 285 and a first parasitic resistor 260, and the first parasitic bipolar transistor 285 and the first parasitic resistor 260 are induced by the intrinsic semiconductor characteristic of the first metal oxide semiconductor transistor 280.

Please note that, for brevity, only one circuit module 210 is showed in FIG. 2; however this is not a limitation of the present invention. In other words, the integrated circuit 200 having the electrostatic discharge (ESD) protection circuit may comprise a plurality of circuit modules in another embodiment of the present invention. Furthermore, the first power pad 201 is coupled to the terminal VDD, and the second power pad 202 is coupled to the terminal VSS in this embodiment, however the number of the circuit module 210, and the connectivity between the power terminals and the first power pad and second power pad are also not the limitation of the present invention. In other words, in another embodiment of the present invention, there are a plurality of circuit modules, in which the first power pad is coupled to the terminal VSS and the second power pad is coupled to the terminal VDD, which also falls within the scope of the present invention.

The operation of the ESD circuit of the present invention is described through applying a PS mode ESD testing upon the integrated circuit 200 as shown in FIG. 2. In the PS mode, the ESD having the positive voltage occurs at the signal pad 230 and is discharged through the second power pad 202 (i.e., terminal VSS). In addition, the second power pad 202 (i.e., terminal VSS) is grounded.

As shown in FIG. 2, the positive voltage of the ESD signal induces a current $I_{esd}$ to flow from the signal pad 230 to the first power pad 201 (i.e., terminal VDD) and to turn on the power clamp circuit 220 (i.e., the first metal oxide semiconductor transistor 280). Furthermore, when the current $I_{bias}$ flows through the collector node of the first bipolar transistor 250 and the first parasitic resistor 260, the first parasitic bipolar transistor 285 is turned on. Therefore, a second current path for the ESD signal is provided.

Accordingly, compared with the conventional method, the conducting path of the ESD current has an extra current path (i.e., $I_{bias}$) other than the original current path ($I_{esd}$), in which the extra current path is induced by the substrate triggering mechanism and the first bipolar transistor 250 in the circuit module 210. By replacing the conventional diode element with the bipolar transistor 250 and by applying the substrate triggering mechanism, the present invention improves the ability to discharge the ESD signal in the PS mode under the same chip size as conventional circuits. In addition, the present invention improves the problem that arises from the inconsistent turn-on time of the metal oxide semiconductor transistors in the power clamp circuit, as this problem may worsen especially in a large size integrated circuit.

Therefore, the disclosed circuit configuration in the first embodiment of the present invention is capable to discharge more ESD current under the same layout area as compared with the conventional circuits, and particularly for the integrated circuit where the ESD signal protection ability under the PS mode is the main concern. Thus, according to the above-mentioned disclosure, the present invention is capable to enhance the ability to discharge the ESD signal under the same layout area.

Figure 3:
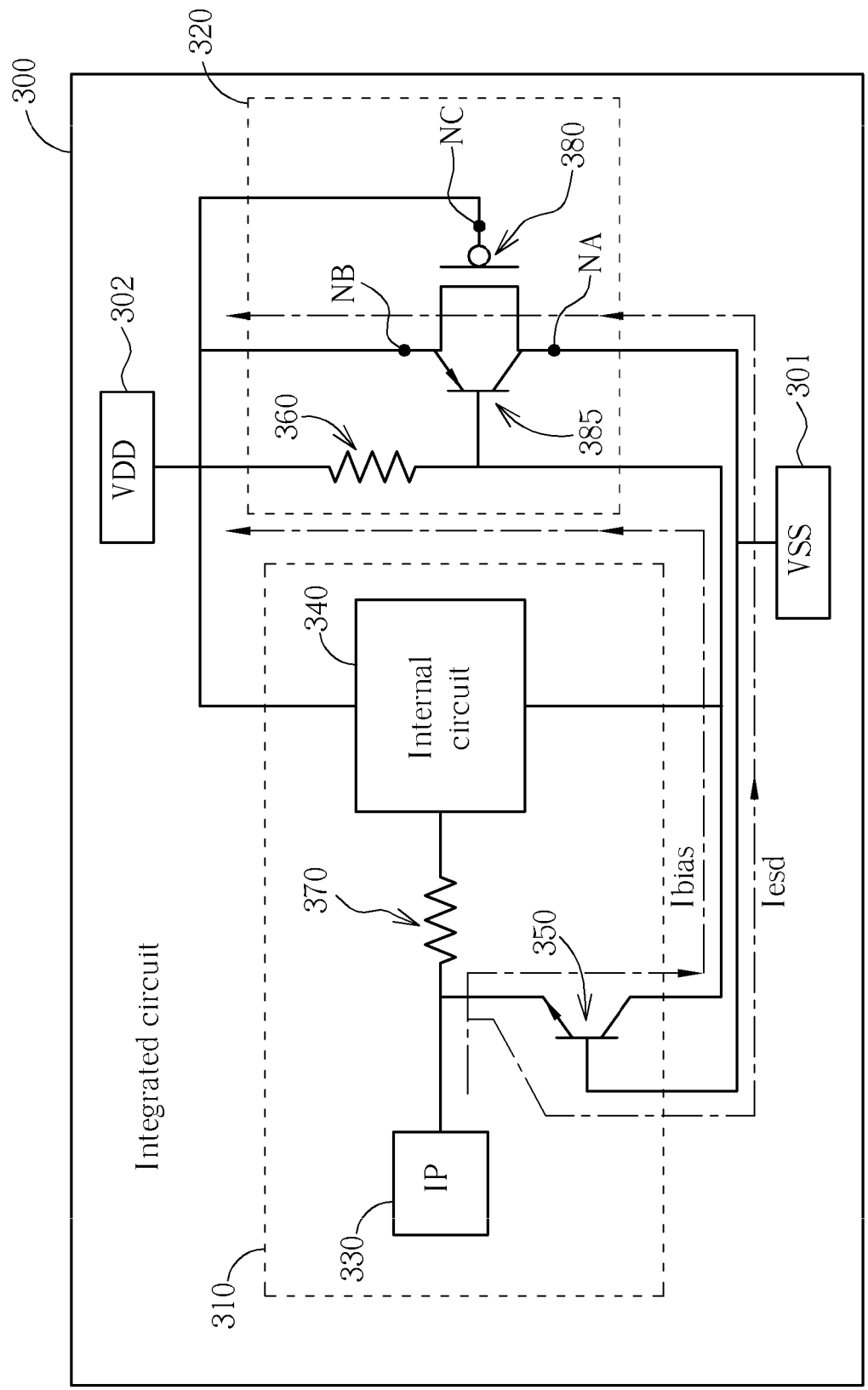
FIG. 3 is a diagram illustrating the integrated circuit having the electrostatic discharge protection circuit according to a second embodiment of the present invention.

Please refer to FIG. 3. FIG. 3 is a diagram illustrating an integrated circuit 300 having an electrostatic discharge (ESD) protection circuit according to a second embodiment of the present invention. The integrated circuit 300 comprises a first power pad 301, a second power pad 302, a circuit module 310, and a power clamp circuit 320. Furthermore, the power clamp circuit 320 of the integrated circuit 300 comprises a first parasitic bipolar transistor 385. In addition, according to the second embodiment of the present invention, the first power pad 301 is coupled to a terminal VSS, and the second power pad 302 is coupled to a terminal VDD.

As shown in FIG. 3, the circuit module 310 comprises a signal pad 330 (e.g., a signal input pad), an internal circuit 340, a first bipolar transistor 350, and an impedance device 370. The internal circuit 340 in the circuit module 310 is coupled between the first power pad 301 (i.e. terminal VSS) and the second power pad 302 (i.e., terminal VDD). The first bipolar transistor 350 has a base node coupled to the first power pad 301 (i.e., terminal VSS), and an emitter node coupled to the signal pad 330. Furthermore, a first parasitic resistor 360 is induced between a collector node of the first bipolar transistor 350 and the second power pad 302 (i.e., terminal VDD).

According to the second embodiment, the first bipolar transistor 350 in the circuit module 310 is an N type bipolar transistor, but this is not a limitation of the present invention. In other words, according to another embodiment of the present invention, the circuit module 310 can also comprise an N type bipolar transistor in conjunction with a P type bipolar transistor. The various designs of the bipolar transistor of the circuit module 310 are disclosed in the following description.

As shown in FIG. 3, the power clamp circuit 320 is coupled between the first power pad 301 (i.e., terminal VSS) and the second power pad 302 (i.e., terminal VDD). In this embodiment, the power clamp circuit 320 comprises a first metal oxide semiconductor transistor 380 in this embodiment. However, the power clamp circuit 320 can also be implemented by two kinds of metal oxide semiconductor transistors in another embodiment of the present invention, such as N type and P type metal oxide semiconductor transistors. In other words, the first metal oxide semiconductor transistor 380 shown in FIG. 3 is only for the purpose of description, and the related operation will be disclosed in the following description.

Please refer to FIG. 3 again. According to the second embodiment, a control node NC of the first metal oxide semiconductor transistor 380 is coupled to the second power pad 302 (i.e., terminal VDD), a first connection node NA is coupled to the first power pad 301 (i.e., terminal VSS), and a second connection node NB is coupled to the second power pad 302 (i.e., terminal VDD). Since the first metal oxide semiconductor transistor 380 is implemented by a P type metal oxide semiconductor transistor, the above-mentioned control node NC is a gate node, the first connection node NA is a drain node, and the second connection node NB is a source node. Furthermore, a collector node of the first parasitic bipolar transistor 385 is coupled to the first connection node NA of the first metal oxide semiconductor transistor 380, an emitter node of the first parasitic bipolar transistor 385 is coupled to the second connection node NB of the first metal oxide semiconductor transistor 280, and a base node of the first parasitic bipolar transistor 385 is coupled to the collector of the first bipolar transistor 350 in the circuit module 310 and the first parasitic resistor 360.

Please note that the first parasitic bipolar transistor 385 and the first parasitic resistor 360 are caused by the semiconductor configuration of the first metal oxide semiconductor transistor 380.

Then, the operation of the ESD circuit of the present invention is described through applying an ND mode ESD testing upon the integrated circuit 300 as shown in FIG. 3. In the ND mode, the ESD having negative voltage occurs at the signal pad 330 and is discharged through the second power pad 302 (i.e., terminal VDD). In the ND mode, the second power pad 302 (i.e., terminal VDD) is grounded, and the first power pad 301 (i.e., terminal VSS) and the other pads are floating.

When the integrated circuit 300 suffers from the ESD signal under the ND mode, the negative voltage of the ESD signal induces a current $I_{esd}$ to flow from the signal pad 330 to the first power pad 301 (i.e., terminal VSS) and to turn on the power clamp circuit 320. Furthermore, when the current $I_{bias}$ flows through the collector node of the first bipolar transistor 350 and the first parasitic resistor 360, the first parasitic bipolar transistor 385 can be turned on. Therefore, a second current path for the ESD signal is provided by the second embodiment of the present invention under the ND mode while the conventional methods only provide one current path for discharging the ESD signal.

Accordingly, compared with the conventional method, the conducting path of the ESD current has an extra current path (i.e., $I_{bias}$) as well as the original current path ($I_{esd}$), in which the extra current path is induced by the substrate triggering mechanism and the first bipolar transistor 350. Therefore, by replacing the conventional diode element with the bipolar transistor 350 and by applying the substrate triggering mechanism, the present invention improves the ability to discharge the ESD signal under the ND mode of the same chip size as a conventional circuit. In addition, the present invention improves the problem that arises from the inconsistent turn-on time of the metal oxide semiconductor transistors in the power clamp circuit, as this problem may worsen especially in a large size integrated circuit.

Therefore, the disclosed circuit configuration in the second embodiment of the present invention is capable of discharging more ESD current under the same layout area as compared with a conventional circuit, and particularly for an integrated circuit where the ESD signal protection ability under the ND mode is the main concern. Thus, according to the above-mentioned disclosure, the present invention is capable of enhancing the ability to discharge the ESD signal under the same layout area.

Please note that, for brevity, only one circuit module 310 is shown in FIG. 3, but this is not meant to be a limitation of the present invention. In other words, in another embodiment of the present invention, a plurality of circuit modules 310 can also be applied in the integrated circuit having the ESD protection circuit, which also belongs to the scope of the present invention, and the related operation will be disclosed in the following description.

Figure 4:
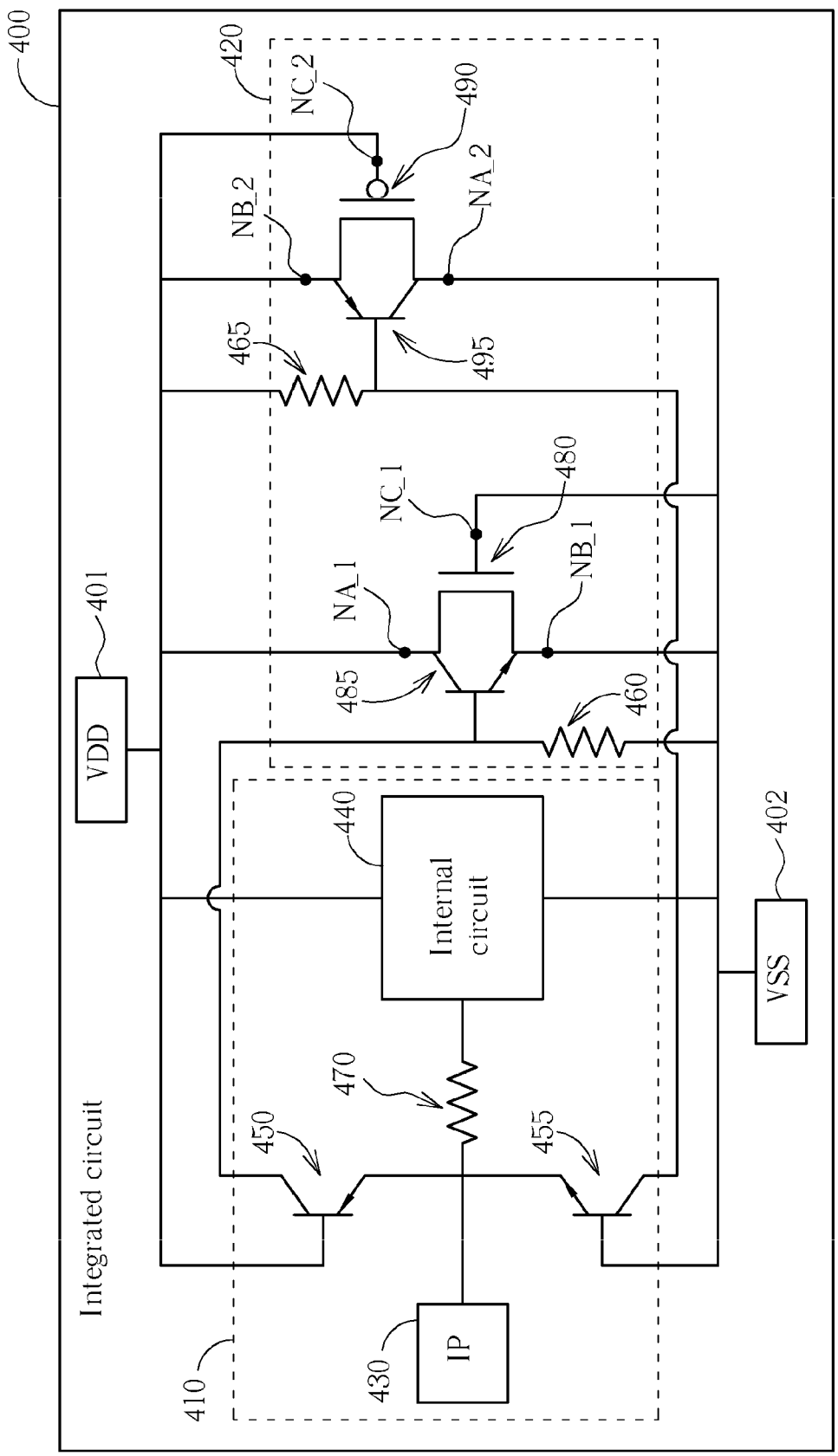
FIG. 4 is a diagram illustrating the integrated circuit having the electrostatic discharge protection circuit according to a third embodiment of the present invention.

Please refer to FIG. 4. FIG. 4 is a diagram illustrating an integrated circuit 400 having an electrostatic discharge (ESD) protection circuit according to a third embodiment of the present invention. The integrated circuit 400 enhances the ability to discharge the ESD signal under the PS mode and the ND mode. The integrated circuit 400 comprises a first power pad 401 (i.e., terminal VDD), a second power pad 402 (i.e., terminal VSS), a circuit module 410, and a power clamp circuit 420.

As shown in FIG. 4, the circuit module 410 comprises a signal pad 430, an internal circuit 440, a first bipolar transistor 450, and a second bipolar transistor 455. The circuit module 410 may further comprise an impedance device 470 according to the practical requirement. The internal circuit 440 in the circuit module 410 is coupled between the first power pad 401 and the second power pad 402.

Since the connectivity of the emitter node, the base node, and the collector node of the first bipolar transistor 450 is similar to the connectivity of the first bipolar transistor 250 of the first embodiment, the detailed description is omitted here for brevity. Similarly, since the connectivity of the emitter node, the base node, and the collector node of the first bipolar transistor 455 is similar to the connectivity of the first bipolar transistor 350 of the second embodiment as shown in FIG. 3, the detailed description is omitted here too.

The power clamp circuit 420 comprises a first metal oxide semiconductor transistor 480 and a second metal oxide semiconductor transistor 490. The control node NC_1, the first connection node NA_1, and the second connection node NB_1 of the first metal oxide semiconductor transistor 480 are coupled to the second power pad 402, the first power pad 401, and the second power pad 402, respectively. In addition, the control node NC_2, the first connection node NA_2, and the second connection node NB_2 of the second metal oxide semiconductor transistor 490 of the power clamp circuit 420 are coupled to the first power pad 401, the second power pad 402, and the first power pad 401, respectively. According to the third embodiment of the present invention, the first metal oxide semiconductor transistor 480 is an N type metal oxide semiconductor transistor, and the second metal oxide semiconductor transistor 490 is a P type metal oxide semiconductor transistor.

Since a first parasitic bipolar transistor 485 and a first parasitic resistor 460 induced by the first metal oxide semiconductor transistor 480 and the second metal oxide semiconductor transistor 490 of the power clamp circuit 420 have the similar connectivity with the above-mentioned first embodiment (i.e., the connectivity between the elements 280, 285, and 260 of the power clamp circuit 220 in FIG. 2.), the detailed description is omitted here for brevity.

Furthermore, since a second parasitic bipolar transistor 495 and a second parasitic resistor 465 induced by the second metal oxide semiconductor transistor 490 and the second metal oxide semiconductor transistor 495 of the power clamp circuit 420 have the similar connectivity with the above-mentioned second embodiment (i.e., the connectivity between the elements 380, 385, and 360 of the power clamp circuit 320 in FIG. 3.), the detailed description is omitted here for brevity.

Similar to the above-mentioned first embodiment, a first parasitic resistor 460 is induced between the collector node of the first bipolar transistor 450 and the second power pad 402 (i.e., terminal VSS) of the third embodiment, and the first parasitic resistor 460 is induced by the intrinsic semiconductor characteristic of the first metal oxide semiconductor transistor 480. Similarly, a first parasitic bipolar transistor 485 is further induced by the intrinsic semiconductor characteristic of the first metal oxide semiconductor transistor 480 in the power clamp circuit 420 of the integrated circuit 400.

Furthermore, similar to the above-mentioned second embodiment, a second parasitic resistor 465 is induced between the collector node of the second bipolar transistor 455 and the first power pad 401 (i.e., terminal VDD), and the second parasitic resistor 465 is induced by the intrinsic semiconductor characteristic of the second metal oxide semiconductor transistor 490. Similarly, a second parasitic bipolar transistor 495 is further induced by the intrinsic semiconductor characteristic of the second metal oxide semiconductor transistor 490 in the integrated circuit 400. As shown in FIG. 4, the collector node of the second parasitic bipolar transistor 495 is coupled to the first connection node NA_2 of the second metal oxide semiconductor transistor 490, the emitter node is coupled to the second connection node NB_2 of the second metal oxide semiconductor transistor 490, and the base node is coupled to the collector node of the second bipolar transistor 455 of the circuit module 410 and the second parasitic resistor 465.

In the third embodiment as shown in FIG. 4, when the ESD signal occurs under the PS mode, the operation of the circuits and the connectivity between each element in the integrated circuit under the ESD discharging mode are similar to the case of the first embodiment as shown in FIG. 2; and when the ESD signal occurs under the ND mode, the operation of the circuits and the connectivity between each element in the integrated circuit under the ESD discharging mode are similar to the case of the second embodiment as shown in FIG. 3. Thus, please refer to the above-mentioned disclosure for the detailed description.

When the ESD signal occurs in the integrated circuit 400 under the PS mode, the positive voltage of the ESD signal is discharged from the signal pad 430 to the second power pad 402 (i.e., terminal VSS) as described in the above-mentioned disclosure. At the same time, the pad connected to VSS is grounded, and the first power pad 401 (i.e., terminal VDD) is floating. Therefore, the positive voltage of the ESD signal induces a current to flow from the signal pad 430 to the first power pad 401 (i.e., terminal VDD), and to turn on the power clamp circuit 420. When the current (i.e., bypass current) flows through the collector of the first bipolar transistor 450 and the first parasitic resistor 460, the bypass current triggers and turns on the first parasitic bipolar transistor 485. Therefore, the second current path for the ESD signal is provided under the PS mode.

In addition, when the ESD signal occurs in the integrated circuit 400 under the ND mode, the negative voltage of the ESD signal occurs in the signal pad 430 and discharged from the signal pad 430 to the first power pad 401 (i.e., terminal VDD). Under the ND mode, the first power pad 401 is grounded, and the second power pad 402 (i.e., terminal VSS) and the rest of the pads are floating. As shown in FIG. 4, when the ESD signal occurs in the integrated circuit 400 under the ND mode, the negative voltage of the ESD signal induces a current to flow from the signal pad 430 to the second power pad 402 (i.e., terminal VSS), and to turn on the power clamp circuit 420. When the current flows through the collector of the second bipolar transistor 455 and the second parasitic resistor 465, the second parasitic bipolar transistor 495 in the power clamp circuit 420 is triggered and turned on.

Figure 5:
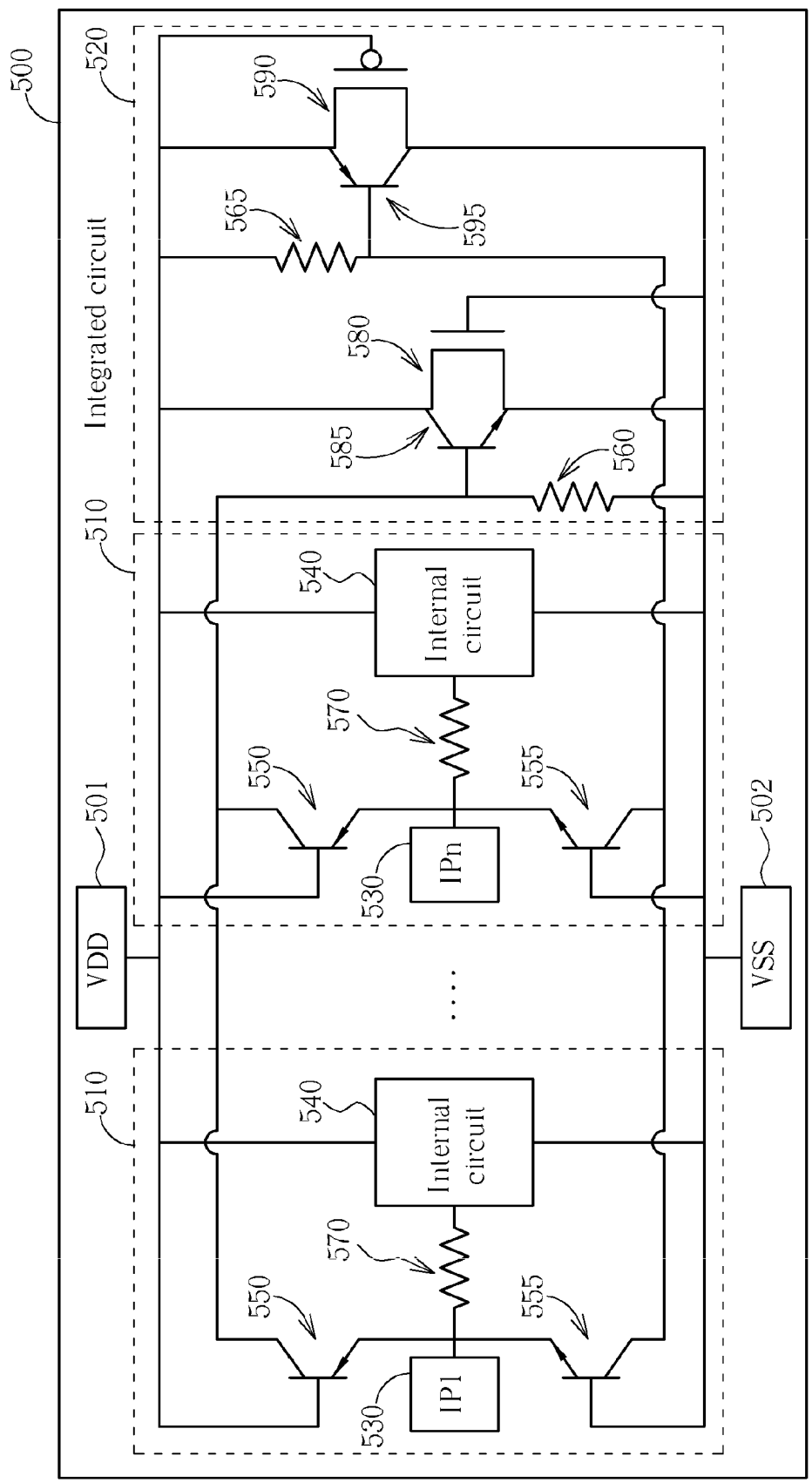
FIG. 5 is a diagram illustrating the integrated circuit having the electrostatic discharge protection circuit according to the third embodiment of the present invention.

Please refer to FIG. 5. FIG. 5 is a diagram illustrating an integrated circuit 500 having an electrostatic discharge (ESD) protection circuit according to the third embodiment of the present invention. As shown in FIG. 5, the integrated circuit 500 comprises a first power pad 501 (i.e., terminal VDD), a second power pad (i.e., terminal VSS), a plurality of circuit modules 510, and a power clamp circuit 520, wherein each circuit module 510 has the similar configuration as shown in FIG. 5. The circuit module 510 comprises a signal pad 530 (e.g., the circuit module 510 has its own signal input pads IP1~IPn), an internal circuit 540, a first bipolar transistor 550 and a second bipolar transistor 555. Furthermore, the circuit module 510 may further comprise an impedance element 470; however this is not a limitation of the present invention. In other words, the impedance element 470 does not need to be utilized in other embodiments if the same function can be obtained, and this modification also belongs to the scope of the present invention. In this embodiment, the power clamp circuit 520 comprises a first metal oxide semiconductor transistor 580 and a second metal oxide semiconductor transistor 590, wherein the first metal oxide semiconductor transistor 580 is an N type metal oxide semiconductor transistor, and the second metal oxide semiconductor transistor 590 is a P type metal oxide semiconductor transistor.

Due to the intrinsic semiconductor characteristic of the first metal oxide semiconductor transistor 580, a first parasitic bipolar transistor 585 and a first parasitic resistor 560 exist in the power clamp circuit 520 of the integrated circuit 500. Similarly, for the second metal oxide semiconductor transistor 590, a second parasitic bipolar transistor 595 and a second parasitic resistor 565 also exist in the power clamp circuit 520 of the integrated circuit 500. Since the circuit configuration in FIG. 5 is derived from the circuit configuration in FIG. 4, those skilled in this art will readily understand the operations and functions of the elements of the configuration as shown in FIG. 5 after reading the above-mentioned disclosure, and thus the detailed description is omitted here for brevity.

Compared to the embodiment as shown in FIG. 4, the plurality of circuit modules 510 uses a power clamp circuit 520, a first power pad 501 (i.e., terminal VDD), and a second power pad 502 (i.e., terminal VSS) in common, to thus greatly reduce the layout area and the cost of the integrated circuit 500. Conventionally, the PS mode and the ND mode have the weaker ESD protecting ability among the four ESD modes (i.e., PS mode, NS mode, PD mode, and ND mode) in the integrated circuit; however, utilizing the bipolar transistor 550 and 555 to replace the traditional diode element and utilizing the substrate triggering technique (i.e., through the parasitic resistor 560, 565, and the parasitic bipolar transistor 585, 595 induced by the metal oxide semiconductor transistors 580, 590) can improve the ESD protection ability of a chip under the PS mode and the ND mode as illustrated in the above-mentioned disclosure. Furthermore, although only one power clamp circuit has been utilized in the ESD protection circuit of the present invention, the integrated circuit 500 can have multiple numbers of circuit modules 510 having different internal circuits 540. In other words, the present invention not only improves the ESD protection ability of the circuit modules 510 individually, but the layout area of the ESD protection circuit is also reduced, which increases the usability and reduces the cost of the chip.

In addition, for practical requirements, if only the ESD protection ability under the PS mode or the ND mode of the integrated circuit is particularly required, then only one first metal oxide semiconductor transistor is utilized in the power clamp circuit in accordance with the above-mentioned disclosure. In other words, if the ESD protection ability under the PS mode needs to be improved, the N type metal oxide semiconductor transistor can be utilized as the first metal oxide semiconductor transistor of the power clamp circuit. Furthermore, if the ESD protection ability under the ND mode needs to be improved, the P type metal oxide semiconductor transistor can be utilized as the first metal oxide semiconductor transistor of the power clamp circuit.

In addition, the impedance elements (e.g., the impedance elements 105, 270, 370, 470, 570 as shown in FIG. 1~5) in the circuit module are not meant to be limitations of the present invention, and the circuitry as shown in FIG. 1~5 is only for illustration and does not necessarily represent the practical configuration in the semiconductor product. Any semiconductor configurations having the same function as the above-mentioned disclosure also belongs to the scope of the present invention. In other words, through the above-mentioned techniques, any circuit configurations that utilizes the parasitic element induced by the metal oxide semiconductor transistor for providing an extra ESD signal discharging path to improve/enhance the ESD protection ability, and for improving the problem emerging from the inconsistent turn-on time of the metal oxide semiconductor transistor of the power clamp circuit belongs to the scope of the present invention.

Those skilled in the art will readily observe that numerous modifications and alterations of the device and method may be made while retaining the teachings of the invention.

What is claimed is:

1. An integrated circuit having an electrostatic discharge (ESD) protection circuit, comprising:
a first power pad;
a second power pad;
at least one circuit module, comprising:
a signal pad;
an internal circuit, coupled between the first power pad and the second power pad; and
a first bipolar transistor, having a base node coupled to the first power pad, and an emitter node coupled to the signal pad, wherein a first parasitic resistor is coupled between a collector node of the first bipolar transistor and the second power pad; and
a power clamp circuit, coupled between the first power pad and the second power pad, the power clamp circuit comprising:
at least a first metal oxide semiconductor transistor, having a control node coupled to the second power pad, a first connection node coupled to the first power pad, and a second connection node coupled to the second power pad; and
at least a first parasitic bipolar transistor, having a collector node coupled to the first connection node of the first metal oxide semiconductor transistor, an emitter node coupled to the second connection node of the first metal oxide semiconductor transistor, and a base node coupled to the collector node of the first bipolar transistor and the first parasitic resistor.

2. The integrated circuit of claim 1, wherein the circuit module further comprises:
a second bipolar transistor, having a base node coupled to the second power pad, and an emitter node coupled to the signal pad, wherein a second parasitic resistor is coupled between the collector node of the second bipolar transistor and the first power pad; and
the power clamp circuit further comprises:
a second metal oxide semiconductor transistor and a second parasitic bipolar transistor, a control node of the second metal oxide semiconductor transistor being coupled to the first power pad, a first connection node of the second metal oxide semiconductor transistor being coupled to the second power pad, a second connection node of the second metal oxide semiconductor transistor being coupled to the first power pad; a collector node of the second parasitic bipolar transistor being coupled to the first connection node of the second metal oxide semiconductor transistor, an emitter node of the second parasitic bipolar transistor being coupled to the second connection node of the second metal oxide semiconductor transistor, and a base node of the second parasitic bipolar transistor being coupled to the collector node of the second bipolar transistor and the second parasitic resistor.

3. The integrated circuit of claim 2, further comprising a plurality of circuit modules, where all of the collector nodes of the first bipolar transistors in each of the circuit modules are coupled to the first parasitic resistor and the base node of the first parasitic bipolar transistor, and all of the collector nodes of the second bipolar transistors in each of the circuit modules are coupled to the second parasitic resistor and the base node of the second parasitic bipolar transistor.

4. The integrated circuit of claim 1, further comprising an impedance device, coupled between the signal pad and the internal circuit.

5. The integrated circuit of claim 1, wherein the first metal oxide semiconductor transistor is an N type metal oxide semiconductor transistor.

6. The integrated circuit of claim 1, wherein the first metal oxide semiconductor transistor is a P type metal oxide semiconductor transistor.

7. The integrated circuit of claim 1, further comprising a plurality of circuit modules, where all of the collector nodes of the first bipolar transistors in each of the circuit modules are coupled to the first parasitic resistor and the base node of the first parasitic bipolar transistor.

* * * * *